United States Patent [19]

Purdy

[11] Patent Number: 4,804,287

[45] Date of Patent: Feb. 14, 1989

[54] APPARATUS FOR INSERTING, SECURING AND EXTRACTING RECEPTACLES, SUCH AS EQUIPMENT CASES

[75] Inventor: Calvin W. Purdy, Wayne, N.J.

[73] Assignee: ITT Avionics, Nutley, N.J.

[21] Appl. No.: 10,024

[22] Filed: Feb. 2, 1987

[51] Int. Cl.[4] ................................................ B25G 3/00
[52] U.S. Cl. ........................................ 403/16; 29/764; 361/399
[58] Field of Search ................... 403/16; 361/399, 415; 29/764, 758, 747

[56] References Cited

U.S. PATENT DOCUMENTS 4,506,439  3/1985  Roake ............................. 361/399 X
4,519,130  5/1985  Schaefer ............................... 29/764

Primary Examiner—Andrew V. Kundrat
Attorney, Agent, or Firm—Robert A. Walsh; Thomas N. Twomey; Mary C. Werner

[57] ABSTRACT

A device is disclosed by which a portable receptacle can be inserted onto, secured to and extracted from a stationary support. The device utilizes a pair of cooperating securing members, one of which is attached to the support and the other of which is attached to the receptacle. The securing member on the receptacle is stationary. The other securing member is movable linearly and rotatably. When the two securing members are engaged with each other, they can cooperate in connection with the insertion, securement and extraction of the receptacle.

13 Claims, 4 Drawing Sheets 4,804,287

APPARATUS FOR INSERTING, SECURING AND EXTRACTING RECEPTACLES, SUCH AS EQUIPMENT CASES

The Government has rights in this invention pursuant to Contract No. N00019-81-C-0369 awarded by the Department of the Navy.

FIELD OF THE INVENTION

The present invention relates to inserting securing and extracting apparatus, and, more particularly, to such apparatus by which a portable receptacle, such as an equipment case, can be inserted onto, secured to and extracted from a stationary support, such as a horizontal rack.

BACKGROUND OF THE INVENTION

Swing-bolt, hold-down devices have been used in the aviation industry to retain equipment cases on mounting racks. Such devices generally operate by securing a collar over a retaining hook which is attached to a front panel of the equipment case. The collar is forced down onto the hook by a nut and threaded rod, the threaded rod being pivotally attached to the mounting rack.

Some of the devices described in the preceding paragraph just secure the equipment case to the mounting rack. Others facilitate the insertion of the equipment case onto the mounting rack, as well as secure the case to the rack. Most of these devices are not, however, designed to facilitate the extraction of the equipment case from the mounting rack.

In the aviation industry especially, the equipment case often interfaces with the mounting rack through blind electrical connectors which include a plurality of mated connector pins. The extraction force required to overcome friction between the mated connector pins can exceed two hundred pounds, thereby making the normal manual extraction of the equipment case difficult.

Although some swing-bolt, hold-down devices are adapted to facilitate the extraction of the equipment case from the mounting rack, these devices require a portion of the equipment case to protrude below the mounting rack. Such a protrusion of the equipment case can, in some cases, complicate the insertion of the equipment case onto the mounting rack.

SUMMARY OF THE INVENTION

The problems and disadvantages of the prior art devices discussed above are overcome in accordance with the present invention by providing a new and improved securing device by which a portable receptacle can be inserted onto, secured to and extracted from a stationary support. More particularly, the new and improved device includes a first securing member attached to the receptacle and a second securing member attached to the support. The second securing member is mounted on a mounting rod or shaft such that the second securing member is movable along the mounting rod in one direction toward the first securing member and in an opposite direction. The second securing member is also movable between a position in which the second securing member engages the first securing member and another position in which the second securing member disengages the first securing member. A driver, which itself is movable along the mounting mechanism, moves the second securing member along the mounting rod to a location in which the second securing member is engageable with the first securing member, whereby the first and second securing members can cooperate with each other to insert the receptacle onto the support and/or to secure the receptacle to the support. The driver, which can be in the form of a handle, also moves the second securing member along the mounting rod in an opposite direction, whereby the second securing member, when it is engaged with the first securing member, cooperates with the first securing member to at least partially extract the receptacle from the support.

In one embodiment, the second securing member is rotatably mounted on the mounting rod such that the second securing member can be rotated into and out of engagement with the first securing member. In this embodiment, the second securing member is coupled to the driver such that the second securing member can be rotated without rotating the driver, which itself may be rotatably mounted on the mounting rod by, for instance, a pair of mating screw threads. So that the securing device will not interfere with the complete extraction of the receptacle, the mounting rod can be pivotally mounted to a floating pivot pin which is supported by a bracket mounted underneath the support, whereby the mounting rod and hence the driver and the second securing member can be pivoted out of the way after the first and second securing members are disengaged from each other. Inasmuch as the first securing member does not protrude below the rack, it does not interfere with the extraction of the receptacle.

In a typical installation, two devices constructed in accordance with the present invention would be employed. The two devices would be identical to each other and would be mounted one alongside the other.

BRIEF DESCRIPTION OF THE DRAWINGS

For a more complete understanding of the present invention, reference is made to the following detailed description of an exemplary embodiment of the invention considered in conjunction with the accompanying drawings, in which.

DESCRIPTION OF THE EXEMPLARY EMBODIMENT

Although the present invention can be used in connection with many different types of receptacles and many different types of receptacle supports, it is especially suitable for use in connection with an aviation equipment case and a mounting rack therefor. Accordingly, the present invention will be described in connection with an aviation equipment case and its associated mounting rack.

Figure 1:
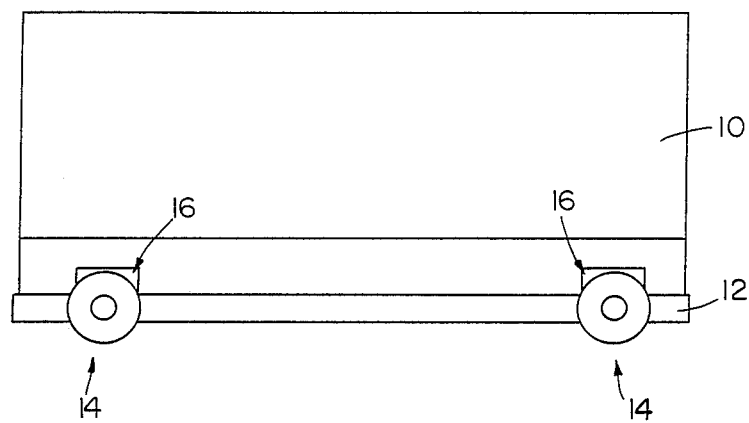
FIG. 1 is a front elevational view of an equipment case secured to a mounting rack by a pair of securing devices constructed in accordance with one exemplary embodiment of the present invention.

Referring to FIG. 1, an aviation equipment case 10 is retained on a horizontal mounting rack 12 by a pair of securing devices 14. The equipment case 10 interfaces with the rack 12 through blind electrical connections (not shown) which include a plurality of mated connector pins (not shown). The equipment case 10 is conventional except that the standard equipment case hooks are replaced with special hooks 16, each of which forms a part of a corresponding one of the securing devices 14. Inasmuch as both of the securing devices 14 are identical, only one of them will be described below.

Figure 2:
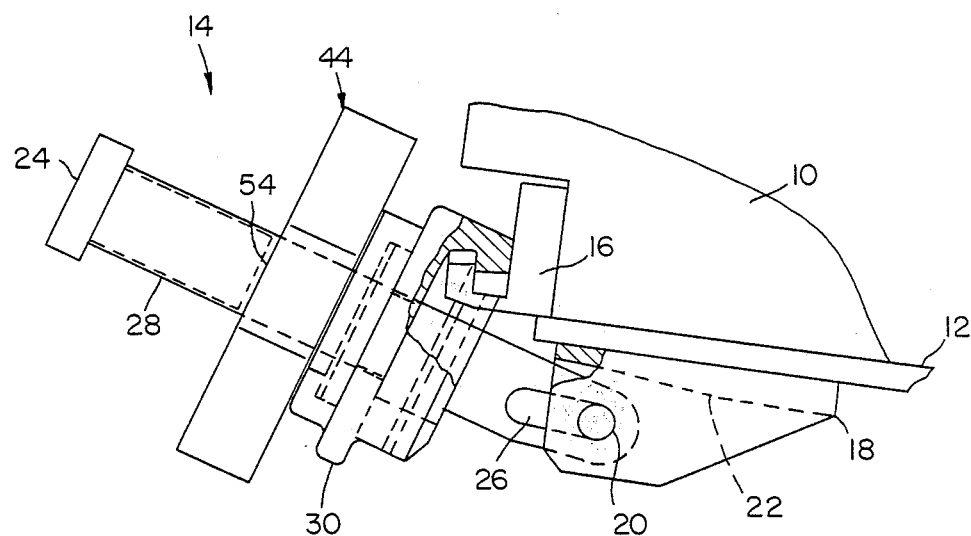
FIG. 2 is a partial side elevational view of the arrangement shown in FIG. 1, portions being broken away to facilitate consideration and discussion.
Figure 3:
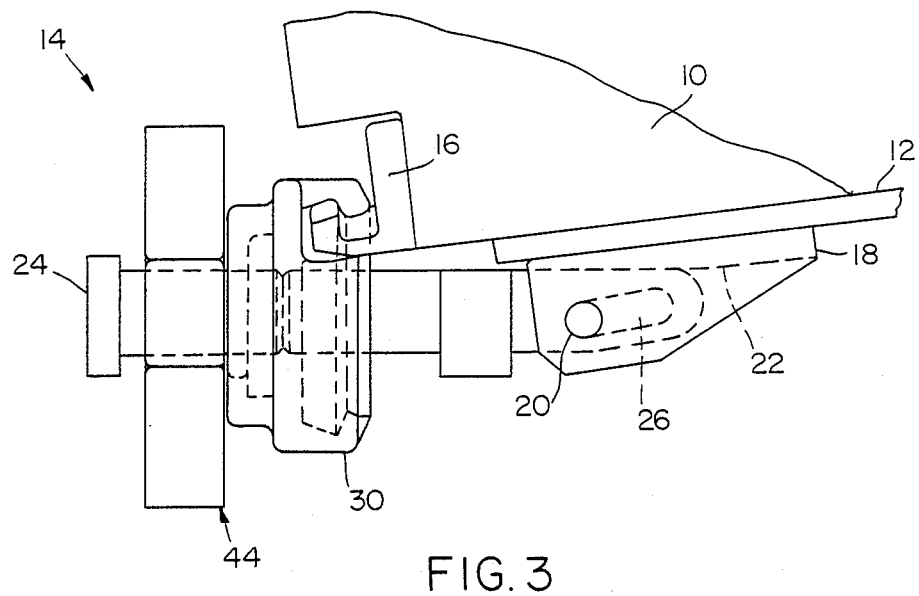
FIG. 3 is a side elevational view similar to that of FIG. 2 except that the equipment case is shown in a partially installed or partially extracted position.

With reference to FIGS. 2 and 3, the securing device 14 includes, in addition to the hook 16, a bracket 18 attached by any suitable means, such as bolts, to the bottom of the rack 12. The bracket 18 includes a pivot pin 20 located below an inclined surface 22 of the bracket 18.

A shaft 24 has an elongated slot 26 which receives the pivot pin 20 such that the shaft 24 is pivotable about and slideable over the pivot pin 20. The slot 26 is arranged at an angle relative the longitudinal axis of the shaft 24 for a purpose to be described hereinafter. The shaft 24 is also provided with external threads 28.

Figure 4:
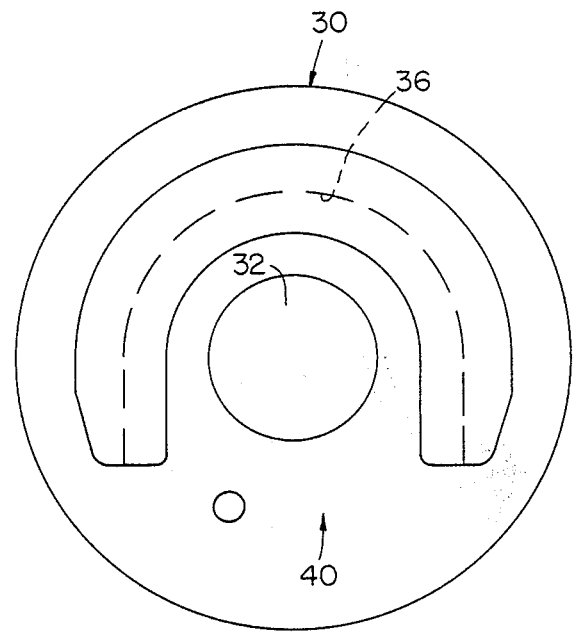
FIG. 4 is a front elevational view of one securing member employed by the present invention.
Figure 5:
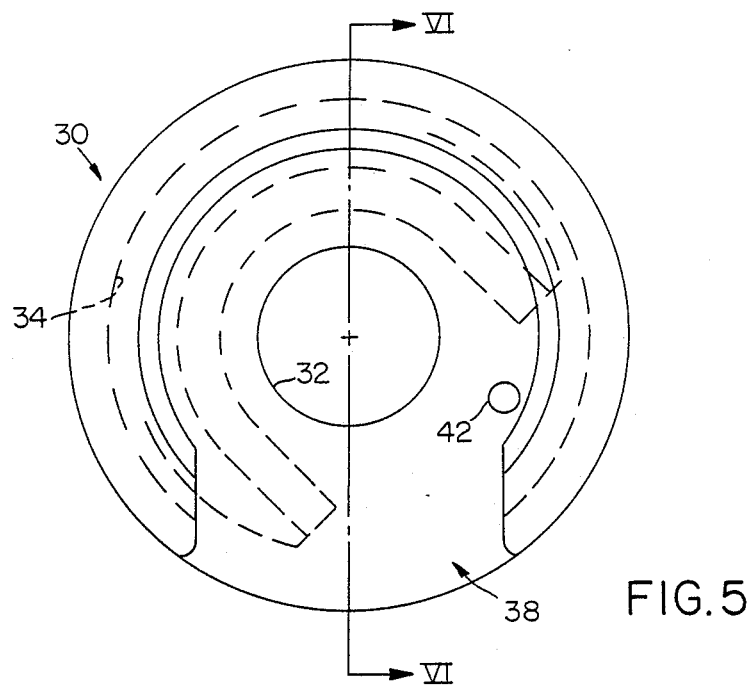
FIG. 5 is a rear elevational view of the securing member shown in FIG. 4.
Figure 6:
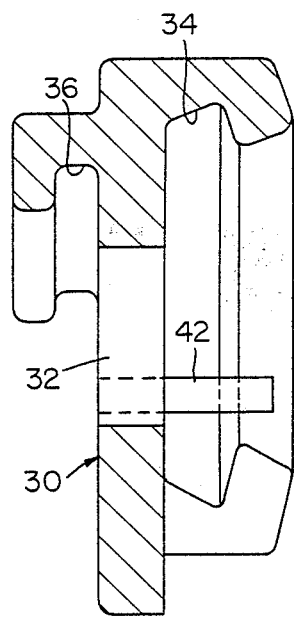
FIG. 6 is a cross-sectional view, taken along the line VI—VI of FIG. 5 and looking in the direction of the arrows, of the securing member illustrated in FIG. 5.

A collar 30 is freely mounted on the shaft 24 such that the collar 30 can slide back and forth along the shaft 24 and such that the collar 30 can be rotated about the shaft 24. With particular reference to FIGS. 4-6, the collar 30 includes a bore 32 through which the shaft 24 passes. The collar 30 is also provided with an internal, semi-circular groove 34 on one side of the collar 30 and another internal, semi-circular groove 36 on an opposite side of the collar 30. An opening 38 provides access to the groove 34, while an opening 40 provides access to the groove 36. The groove 34 is sized and shaped so as to receive the hook 16, the opening 38 permitting the hook 16 pass into the groove 34. A pin 42 is provided on the same side of the collar 30 as the groove 34 and the opening 38. The pin 42 functions as a stop for the hook 16 when the hook 16 is received within the groove 34.

Figure 7:
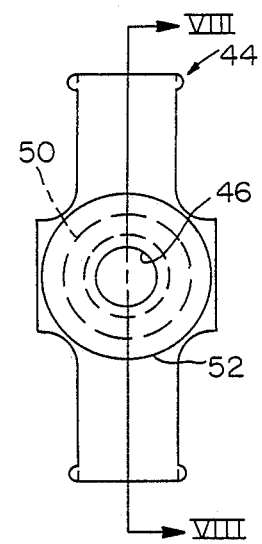
FIG. 7 is a rear elevational view of a handle employed by the present invention.
Figure 8:
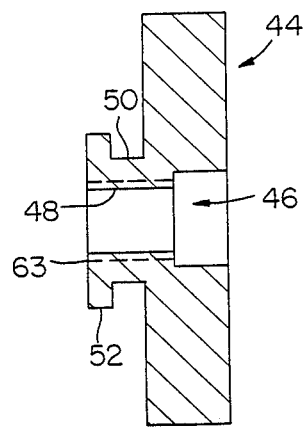
FIG. 8 is a cross-sectional view, taken along the line VIII—VIII of FIG. 7 and looking in the direction of the arrows, of the handle illustrated in FIG. 7.
Figures 9, 10:
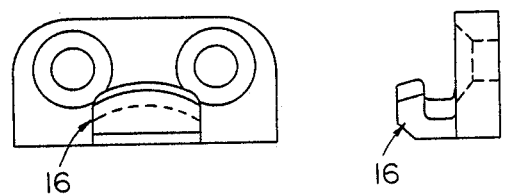
FIG. 9 is a front elevational view of another securing member employed by the present invention.
FIG. 10 is a side elevational view of the securing member shown in FIG. 9.

With reference to FIGS. 2 and 3, in general, and FIGS. 7 and 8, in particular, a handle 44 has a bore 46 which is provided with internal threads 48 adapted to threadedly engage the external threads 28 on the shaft 24 such that upon the rotation of the handle 44 in one arcuate direction the handle 44 moves along the shaft 24 in one linear direction, and such that upon the rotation of the handle 44 in an opposite arcuate direction the handle 44 moves along the shaft 24 in an opposite linear direction. The handle 44 also includes a cylindrical barrel 50 having a circular flange 52 extending radially outwardly from one end and a pair of ears extending radially outwardly from an opposite end. The flange 52 is sized and shaped so as to be rotatably received within the groove 36 of the collar 30, the opening 40 permitting the flange 52 to pass into the groove 36 before the handle 44 and the collar 30 are mounted on the shaft 24. Thus, the flange 52 cooperates with the groove 36 to couple the handle 44 to the collar 30, whereby the handle 44 and the collar 30 move conjointly along the shaft 24 as a unit. However, because the flange 52 is rotatably received within the groove 36, the collar 30 can be rotated about the shaft 24 independently of any rotation of the handle 44.

The operation of the present invention will now be described with reference to FIGS. 1-3. In order to insert the equipment case 10 onto the rack 12, the case would be manually positioned on the rack 12 and then slid over the rack 12 until the connector pins (not shown) are engaged. One of the securing devices 14 is then manipulated into the position illustrated in FIG. 3, whereby the hook 16 is aligned with the opening 38. The collar 30 can then be rotated until the hook 16 contacts the pin 42, whereby the hook 16 is engaged by the collar 30. Upon the rotation of the handle 44 in an appropriate arcuate direction, the handle 44 and hence the collar 30 move along the shaft 24 toward the end which is provided with the slot 26, whereby the shaft 24 slides relative to the bracket 18 until the pivot pin 20 moves relative to the slot 26 from the position illustrated in FIG. 3 to the position illustrated in FIG. 2. When the shaft 24 can no longer move relative to the bracket 18, the continued rotation of the handle 44 causes the further linear movement of the handle 44 and hence the collar 30 along the shaft 24 such that the equipment case 10 is completely inserted onto the rack 12, the force applied to the case 10 by the handle 44 and the collar 30 overcoming the friction produced as a result of the contact between the connector pins (not shown). The shaft 24 may be provided with indicia, such as a red line 54 (see FIG. 2), which provides a visible indication that the equipment case 10 has been completely inserted onto the rack 12.

The above procedure is then repeated for the other one of the securing devices 14. With both of the securing devices 14 in the position illustrated in FIG. 2, the equipment case 10 is firmly secured to the rack 12.

In order to remove the equipment case 10 from the rack 12, the handle 44 of one of the securing devices 14 is rotated in an opposite direction, thereby causing the shaft 24 to slide relative to the bracket 18 until the pivot pin 20 moves relative to the slot 26 from the position illustrated in FIG. 2 to the position illustrated in FIG. 3. During such movement, the angle of inclination of the shaft 24 varies until the shaft 24 lies flat against the inclined surface 22 of the bracket 18. When the shaft 24 can no longer more relative to the bracket 18, the continued rotation of the handle 44 causes the handle 44 and hence the collar 30 to move along the shaft 24 away from the end having the slot 26. Because the hook 16 is engaged by the collar 30, the equipment case 10 moves conjointly with the handle 44 and the collar 30 so as to partially extract the case 10 from the rack 12. The force applied to the equipment case 10 by the handle 44 and the collar 30 overcomes the friction produced as a result of the contact between the connector pins (not shown). By rotating the collar 30 such that the hook 16 is aligned with the opening 38, the collar 30 can be disengaged from the hook 16, thereby permitting the shaft 24 to fall away by gravity.

The above procedure is then repeated for the other one of the securing devices 14. With both of the securing devices out of the way, the equipment case 10 can now be completely removed from the rack 12 manually by, for instance, pulling on a handle (not shown).

It will be understood that the embodiment described herein is merely exemplary and that a person skilled in the art may make many variations and modifications without departing from the spirit and scope of the invention. All such variations and modifications are intended to be included with the scope of the invention as defined in the appended claims.

I claim:

1. Apparatus by which a portable reeptacle can be inserted onto, secured to and extracted from a stationary support, said apparatus comprising securing means for releasably securing a portable receptacle to a stationary support, said securing means including a first securing member attached to the receptacle and a second securing member attached to the support; mounting means for mounting said second securing member such that said second securing member is movable along said mounting means in a first direction toward said first securing member and in a second direction opposite to said first direction and such that said second securing member is movable between a first position in which said second securing member engages said first securing member and a second position in which said second securing member disengages said first securing member; said first securing member is positioned above the support and includes a hook and said second securing member includes engaging means for releasably engaging said hook when said second securing member is in said second position; and moving means movable along said mounting means in said first direction for moving said second securing member in said first direction to a location in which said second securing member is engageable with said first securing member; and said second securing member is rotatably mounted on said mounting means such that said second securing member can be rotated between said first and second positions said engaging means includes a first semi-circular groove provided in said second securing member, said first groove being sized and shaped so as to releasably capture said hook of said first securing member, and a first opening provided on one side of said second securing member, said first opening communicating with said first groove and being sized and shaped so as to permit said hook of said first securing member to pass into and out of said first groove; whereby said first and second securing members can cooperate with each other to insert the receptacle onto the support and/or to secure the receptacle to the support, and for moving said second securing member along said mounting means in said second direction, whereby said second securing member, when it is engaged with said first securing member, cooperates with said first securing member to at least partially extract the receptacle from the support.

2. The apparatus of claim 1, wherein said mounting means includes a shaft having external threads and said moving means is a handle having a bore which is provided with internal threads threadedly engaging said external threads of said shaft, whereby the rotation of said handle in one arcuate direction causes said handle to move along said shaft in said first direction and the rotation of said handle in an opposite arcuate direction causes said handle to move along said shaft in said second direction.

3. The apparatus of claim 2, further comprising coupling means for coupling said handle to said second securing member such that said handle and said second securing member move conjointly along said shaft in said first and second directions and such that said second securing member can be rotated about said shaft between said first and second positions without causing any rotation of said handle.

4. The apparatus of claim 3, wherein said coupling means includes a second semi-circular groove provided in said second securing member, a circular flange provided on said handle, said flange being rotatably received within said second groove, and a second opening provided on an opposite side of said second securing member, said second opening communicating with said second groove and being sized and shaped so as to permit said flange to pass into and out of said second groove.

5. The apparatus of claim 3, wherein said mounting means further includes a bracket fixedly attached to said support and pivoting means for pivotally attaching said shaft to said bracket, said pivoting means including a pivot pin fixedly attached to said bracket and an elongated slot extending through said shaft, said slot receiving said pivot pin so as to permit the relative movement of said pivot pin between opposite ends of said slot.

6. The apparatus of claim 5, wherein said slot is at an angle relative to a longitudinal axis of said shaft, whereby the angle of said shaft varies as said pivot pin moves relative to said slot.

7. A system by which a portable receptacle can be inserted onto, secured to and extracted from a stationary support, said system comprising a plurality of securing devices, each of said securing devices including a first securing member attached to the receptacle and a second securing member attached to the support; mounting means for mounting said second securing member such that said second securing member is movable along said mounting means in a first direction toward said first securing member and in a second direction opposite to said first direction and such that said second securing member is movable between a first position in which said second securing member engages said first securing member and a second position in which said second securing member disengages said first securing member; said first second member is positioned above the support and includes a hook and wherein said second securing member includes engaging means for releasably engaging said hook when said second securing member is in said second position; and moving means movable along said mounting means is said first direction for moving said second securing member in said first direction to a location in which said second securing member is engageable with said first securing member; and said second securing member is rotatably mounted on said mounting means such that said second securing member can be rotated between said first and second positions; said engaging means includes a first semi-circular groove provded in said second securing member, said first groove being sized and shaped so as to releasably capture said hook of said first securing member, and a first opening provided on one side of said second securing member, said first opening communicating with said first groove and being sized and shaped so as to permit said hook of said first securing member to pass into and out of said first groove; whereby said first and second securing members can cooperate with each other to insert the receptacle on to the support and/or to secure the receptacle to the support, and for moving said second securing member along said mounting means in said second direction, whereby said second securing member, when it is engaged with said first securing member, cooperates with said first securing member to at least partially extract the receptacle from the support.

8. The system of claim 7, wherein said mounting means includes a shaft having external threads and said moving means is a handle having a bore which is provided with internal threads threadedly engaging said external threads of said shaft, whereby the rotation of said handle in one arcuate direction causes said handle to move along said shaft in said first direction and the rotation of said handle in an opposite arcuate direction causes said handle to move along said shaft in said second direction.

9. The system of claim 8, further comprising coupling means for coupling said handle to said second securing member such that said handle and said second securing member move conjointly along said shaft in said first and second directions and such that said second securing member can be rotated about said shaft between said first and second positions without causing any rotation of said handle.

10. The system of claim 9, wherein said coupling means includes a second semi-circular groove provided in said second securing member, a circular flange provided on said handle, said flange being rotatable received within said second groove, and a second opening provided on an opposite side of said second securing member, said second opening communicating with said second groove said being sized and shaped so as to permit said flange to pass into and out of said second groove.

11. The system of claim 9, wherein said mounting means further includes a bracket fixedly attached to said support and pivoting means for pivotally attaching said shaft to said bracket, said pivoting means including a pivot pin fixedly attached to said bracket and an elongated slot extending through said shaft, said slot receiving said pivot pin so as to permit the relative movement of said pivot pin between opposite ends of said slot.

12. The system of claim 11, wherein said slot is at an angle relative to a longitudinal axis of said shaft, whereby the angle of said shaft varies as said pivot pin moves relative to said slot.

13. The system of claim 7, wherein there are two securing devices.

* * * * *